(12) United States Patent
Arft et al.

(10) Patent No.: US 12,506,441 B2
(45) Date of Patent: Dec. 23, 2025

(54) MICROELECTROMECHANICAL SYSTEM OVEN-CONTROLLED OSCILLATOR

(71) Applicant: SiTime Corporation, Santa Clara, CA (US)

(72) Inventors: Carl Martin Arft, Danville, CA (US); Sassan Tabatabaei Zavareh, Sunnyvale, CA (US); Aaron Partridge, Lakewood, WA (US); Yushu Ma, Pittsburgh, PA (US); Markus Rudolf Lutz, San Jose, CA (US); Li Ko Chiu, Taoyuan (TW); Kamran Souri, Nootdorp (NL)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 18/527,212

(22) Filed: Dec. 1, 2023

(65) Prior Publication Data

US 2024/0186947 A1    Jun. 6, 2024

Related U.S. Application Data

(60) Provisional application No. 63/429,898, filed on Dec. 2, 2022, provisional application No. 63/430,615, filed on Dec. 6, 2022, provisional application No. 63/434,909, filed on Dec. 22, 2022, provisional application No. 63/434,922, filed on Dec. 22, 2022.

(51) Int. Cl.
*H03B 5/04* (2006.01)
*H03B 5/30* (2006.01)

(52) U.S. Cl.
CPC .............. *H03B 5/04* (2013.01); *H03B 5/30* (2013.01)

(58) Field of Classification Search
CPC .......................................................... H03B 5/04
USPC .......................................................... 331/70
See application file for complete search history.

(56) References Cited

U.S. PATENT DOCUMENTS

| | | | |
|---|---|---|---|
| 8,669,823 B1 | 3/2014 | Olsson | |
| 11,374,535 B2 | 6/2022 | Arft | |
| 2015/0020587 A1 | 1/2015 | Milley | |
| 2020/0212881 A1 | 7/2020 | Bahr | |
| 2020/0403570 A1* | 12/2020 | Ii | H03L 1/028 |
| 2023/0268886 A1* | 8/2023 | Matsukawa | H01L 24/05 331/158 |

* cited by examiner

*Primary Examiner* — Joseph Chang
(74) *Attorney, Agent, or Firm* — Bruce C. Shem (57) ABSTRACT

A microelectromechanical system (MEMS) device is provided with partitioning for thermal management. In one illustrative embodiment, the device may include: a heated section including a first die and a second die, wherein: the first die includes a heater, and the second die is coupled to the first die and includes a temperature sensor and a MEMS resonator; and a non-heated section communicatively coupled to the heated section and including a third die. The third die may receive a first signal associated with the temperature sensor and provides a second signal to the first die associated with the heater based on the first signal.

18 Claims, 11 Drawing Sheets

MICROELECTROMECHANICAL SYSTEM OVEN-CONTROLLED OSCILLATOR

CROSS-REFERENCE TO RELATED APPLICATIONS

This application claims the benefit of U.S. Provisional Application No. 63/429,898, filed Dec. 2, 2022, U.S. Provisional Application No. 63/430,615, filed Dec. 6, 2022, U.S. Provisional Application No. 63/434,909, filed Dec. 22, 2022, and U.S. Provisional Application No. 63/434,922, filed Dec. 22, 2022, each of which are incorporated by reference herein for all purposes.

BACKGROUND

An oscillator may be an electronic circuit that produces a periodic signal. An oscillator may be temperature sensitive, because the frequency of oscillation may depend on the physical properties of its oscillating element, which can change with temperature. For example, material properties that control mechanical behavior, such as the stiffness of a spring, the elasticity of a crystal, or the elasticity or dimensions of a microelectromechanical system (MEMS) resonator, are affected by temperature.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

The terminology used herein is for the purpose of describing particular embodiments only and is not intended to be limiting of the technology. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

As used herein, "A, B, and/or C" is understood to mean only A, only B, only C, A and B, A and C, B and C, or A, B, and C. In addition, "at least one of A, B, and C" is understood to mean only A, only B, only C, A and B, A and C, B and C, or A, B, and C. In other words, combinations of the elements (e.g., A, B, and C). Additionally or alternatively, "A, B, and/or C" and "at least one of A, B, and C" may mean permutations of the elements (e.g., A, B, and C). There may be any number of elements (e.g., A, B, C, and D; A, B, C, D, and E; etc.).

It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity. Moreover, various combinations of the structures, components, materials, and/or elements, other than those specifically shown, are contemplated and are within the scope of the present technology.

Overview

Electronic oscillators are electronic circuits that produce periodic, oscillating electronic signals, such as sine waves and square waves. Electronic oscillators may provide these electronic signals to synchronous digital electronics, such as communications, networking, computing, measurement, and time-keeping circuits and systems. Electronic oscillators may include one or more mechanical resonators (e.g., quartz crystals, microelectromechanical systems (MEMS) resonators, ceramic resonators, and the like), which oscillate with greater amplitude at some frequencies, called resonant frequencies, than at other frequencies. For example, a quartz crystal may change its shape under an electric field, which may be referred to as electrostriction or inverse piezoelectricity. By way of further non-limiting example, a MEMS resonator may include a mechanical structure with an inherent resonant frequency that can oscillate by electrostatic or piezoelectric forces to generate a constant frequency.

Electronic oscillators may include circuits that work in conjunction with the resonator to provide periodic, oscillating signals. The resonant frequency of a resonator may vary with temperature. Effects of temperature sensitivity (e.g., changes in frequency over an operating temperature range, such as 0° C. to +70° C., −40° C. to +85° C., −55° C. to +125° C., and the like) may be reduced by keeping the temperature of the resonator within an oven temperature range (e.g., at a target oven temperature, such as 95° C.±1%. Moreover, some circuits (e.g., oscillator circuit, voltage reference, and the like) may benefit from temperature control. Maintaining the resonator and/or circuits at a higher oven temperature range (e.g., 105° C.±1%) may consume more power than at a lower oven temperature range (e.g., 950±1%), because less power from the heaters may be needed to maintain the lower oven temperature range. Additionally or alternatively, heater power may be reduced by limiting the amount of heat lost by the electronic oscillator due to heat leaking out of the oven.

Oven-Controlled Oscillator

Figure 1:
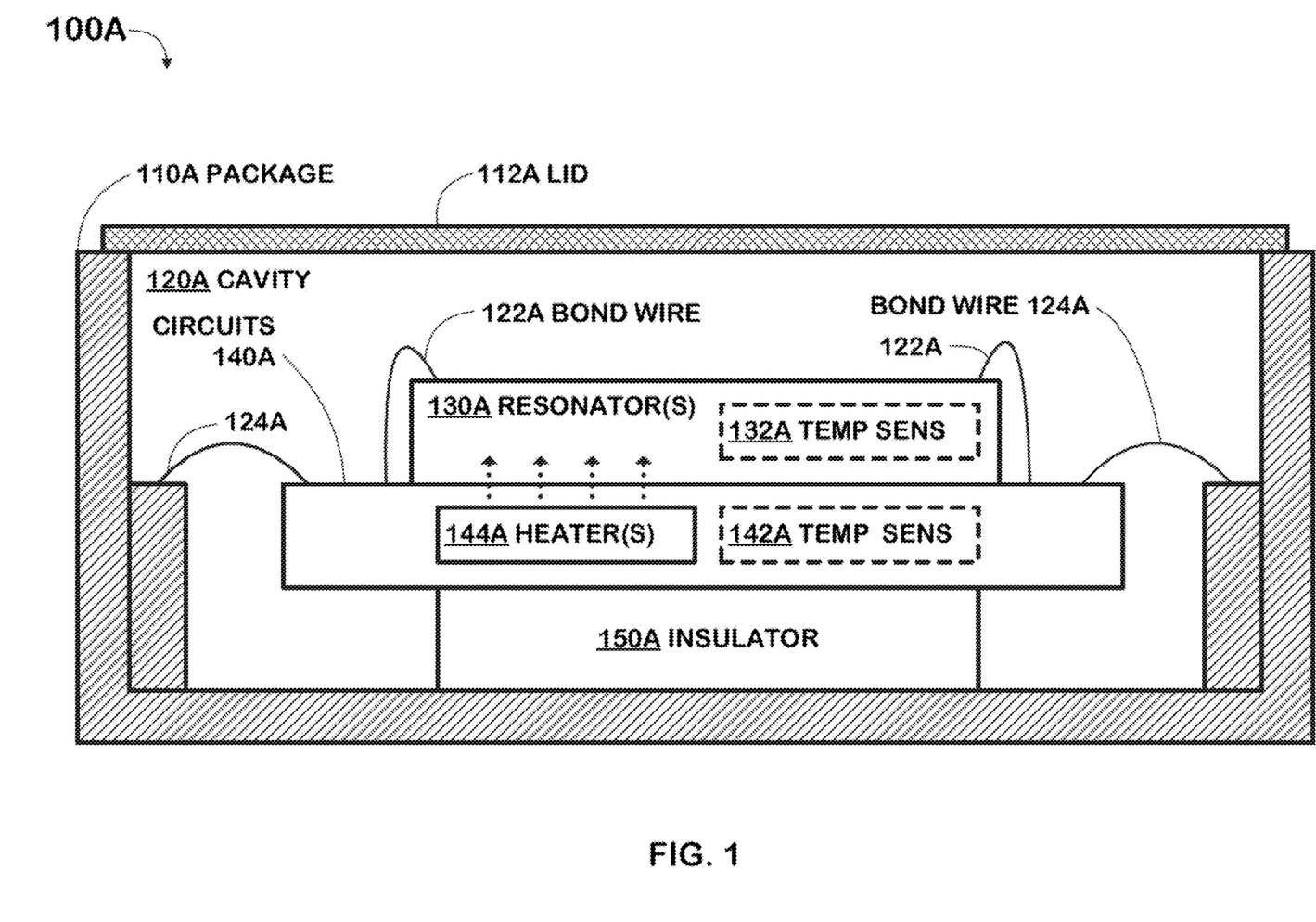
FIG. 1 illustrates an oven-controlled oscillator, according to some embodiments.

FIG. 1 shows oven-controlled oscillator (OCXO) 100A according to some embodiments. Cavity 120A may be a temperature-controlled chamber that may maintain resonator(s) 130A and/or circuit blocks of circuits 140A within an oven temperature range (e.g., at a target oven temperature, such as 95° C., ±1%), hereinafter referred to as at the target temperature. For example, the target temperature may be selected to be at or higher (e.g., with guard band) than the upper limit of an operating temperature range (e.g., 0° C. to +70° C., −40° C. to +85° C., −55° C. to +125° C., and the like). The operating temperature range may be a range of temperatures outside of package 110A at which OCXO 100A may function within predetermined specifications, such as in a datasheet. Heater(s) 144A (and/or a heater(s) in resonator(s) 130A (not depicted in FIG. 1)) may generate heat to raise and/or maintain resonator(s) 130A and/or circuit blocks of circuits 140A at the target temperature. In this way, a temperature experienced by resonator(s) 130A and/or circuit blocks of circuits 140A may be consistently higher than a temperature outside of package 110A. The temperature outside of package 110A may be referred to as the ambient temperature. Effects of changes to the ambient temperature on resonator(s) 130A and/or circuit blocks of circuits 140A may be limited by OCXO 100A.

As shown, resonator 130A may be coupled to electronic circuits 140A and electronic circuits 140A may be coupled to insulator (separator) 150A, such as by using die attach. Die attach may be an adhesive die attach (e.g., polyimide, epoxy, silicone, and the like, and may contain fillers to optimize combinations and permutations of thermal, mechanical, and electrical properties of the adhesive), eutectic die attach (e.g., eutectic alloy), or other type of die-to-die bonding. Heat may be lost from resonator(s) 130A through bond wires 122A, from electronic circuits 140A through bond wires 124A and insulator 150A, and from cavity1 20A through package 110A (including lid 112A). Package 110A may thermally insulate (e.g., have a thermal resistance θ>100° C./W) resonator 130A and/or circuit blocks of circuits 140A from the environment outside of package 110 (e.g., ambient temperature).

By way of non-limiting example, resonator(s) 130A and/or circuits 140A may be semiconductor die (e.g., a small piece of semiconducting material on which a resonator(s) and/or circuits may be fabricated, such as silicon, carbon (e.g., diamond, diamond-like carbon, carbon nanotubes, and graphite), silicon germanium, germanium, III-V compounds (e.g., composed boron, aluminum, gallium, indium, nitrogen, phosphorous, arsenic, and tin), and the like). Additionally, other compound semiconductors from columns 4, 13, 14, and 15 of the periodic table of the elements, such as silicon carbide, aluminum nitride, and (oxides of) zirconium and halfnium, may be used. Moreover, various doping levels may be applied to the foregoing materials. Resonator(s) 130A may optionally include temperature sensor(s) 132A. Circuits 140A may optionally include temperature sensor(s) 142A. Bond wires 122A and bond wires 124A may provide interconnections between resonator 130A and circuits 140A, and circuits 140A and package 110A, respectively. Bond wires 122A and bond wires 124A may each comprise combinations and permutations of aluminum, copper, silver, gold, and the like. Other interconnections, such as solder balls, through-silicon vias (TSVs), and the like may be used. Package 110A may be a ceramic package (e.g., Alumina (Al2O3) multilayered ceramic package), a plastic package (e.g., small outline integrated circuit (SOIC), small outline transistor (SOT), quad flat no-lead (QFN), and the like package), and/or a metal package (e.g., TO-3, TO-41, and the like). Lid 112A may be plastic, metal, combinations thereof, or other materials.

Electronic circuits 140A may operate in conjunction with resonator(s) 130A to produce periodic, oscillating electronic signals. For example, electronic circuits 140A may include sustaining amplifiers having a gain. The sustaining amplifiers may drive resonator 130A in continuous motion and produce output signals at approximately the resonant frequency for the synchronous digital electronics (not depicted in FIG. 1). Electronic circuits may additionally perform temperature compensation, frequency synthesis, temperature measurement, heater control, clock distribution, and the like. By way of non-limiting example, electronic circuits 140A may include combinations and permutations of buffers, heaters, amplifiers, volatile and non-volatile memories, filters, phase-locked loops (PLLs), voltage-controlled oscillators (VCOs), analog to digital converters (ADCs), digital to analog converters (DACs), and the like.

Electronic circuits 140A may generate heat (in addition to heat generated by heater(s) 144A). For example, circuits 140A may consume on the order of 10-200 mW which may heat cavity 120A by 1°–20° C. In this way, the electronic oscillator may be said to be self-heating. Accordingly, the target temperature may additionally or alternatively be selected to be the maximum of the operating temperature range plus an amount of heat produced by self-heating plus guard band.

The amount of heat produced by heater(s) 144A may be reduced by limiting the amount of self-heating, because the target temperature may be set lower (than with more self-heating). In this way, power consumed by heater(s) 144A may be reduced, and OCXO 100A may consume less power. As described below, the amount of power consumed by circuits 140A may be advantageously reduced by moving some circuit blocks to another circuits die that is not temperature controlled. For example, within the same OCXO there may be a "heated" portion which is temperature controlled and a "non-heated" portion which is not temperature controlled. The circuits die in the "heated" portion may have fewer circuit blocks and hence consume less power than, for example, circuits 140A. Self-heating in the circuits die in the "heated" portion may also be accordingly reduced. The target temperature may be lowered because the self-heating is lowered.

In addition, when the power consumption of the circuits die is large, it may limit the maximum thermal resistance of, for example, package 110A and/or insulator 150A, as the self-heating may increase with increased thermal resistance. When the heat produced by circuits 140A plus the ambient temperature is higher than the target temperature, resonator(s) 130A and/or circuit blocks of circuits 140A may not operate at the target temperature. Recall that OCXOs are supposed to keep the resonator and/or some circuit blocks operating at the target temperature. Accordingly, the thermal resistance of insulator 150A and/or package 110A may be reduced to lower the temperature of resonator(s) 130A and/or circuit blocks of circuits 140A down to the target temperature. When OCXO 100A starts up at the ambient temperature, heater(s) 144A may consume more power to heat resonator(s) 130A and/or circuit blocks of circuits 140A to the target temperature, because heat generated by heater(s) 144A may leak out through insulator 150A and/or package 110A due to their lower thermal resistance.

However, when the power consumption of the "heated" circuits is reduced, the thermal resistance of package 110A and insulator 150A may be increased. This may also lead to lower overall power consumption of OCXO 100A because heater(s) 144A may consume less power. Less power may be needed from heater(s) 144A to heat resonator(s) 130A and/or circuit blocks of circuits 140A to the target temperature, because less heat leaks through insulator 150A and/or package 110A due to their higher thermal resistance.

Heated and Non-Heated Partitioning

Figure 2:
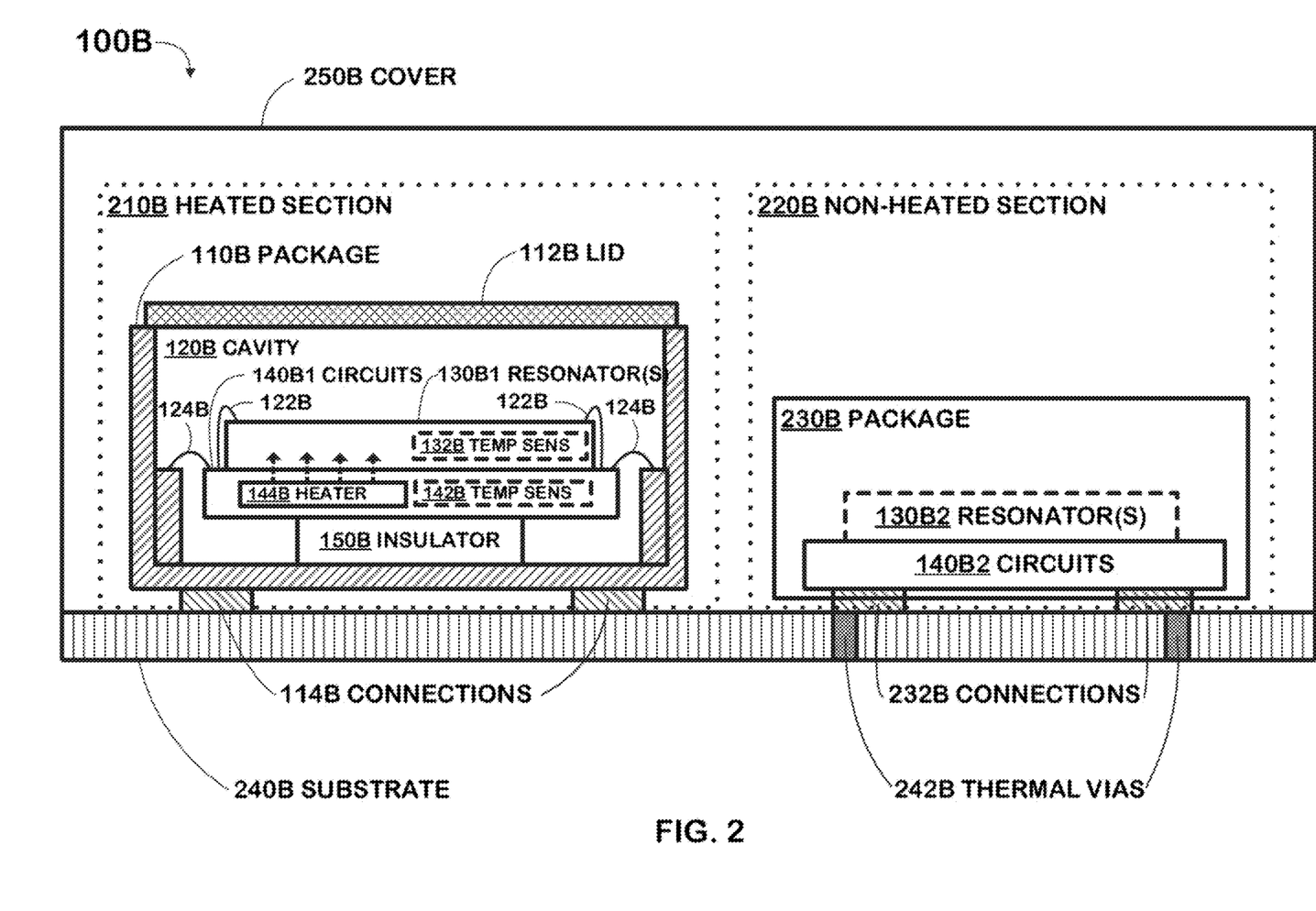
FIG. 2 illustrates another oven-controlled oscillator, according to various embodiments.

FIG. 2 shows OCXO 100B according to some embodiments. OCXO 100B, except as noted below, may have at least some of the characteristics of OCXO 100A (FIG. 1). OCXO 100B may include heated section 210B and non-heated section 220B. Here, heated may refer to heating using heaters (e.g., heater(s) 144B) and non-heated may refer to not heating with heaters (although there may be self-heating). Heated section 210B may include package 110B. Package 110B may include lid 112B. Heated section 210B may be heated to the target temperature by combinations and permutations of heater(s) 144B, a heater(s) in resonator(s) 130B1 (not shown in FIG. 2), and self-heating. Connections 114B and 232B may each be combinations and permutations of pins, solder balls, and the like, and may provide interconnections between package 110B and substrate 240B, and package 230B and substrate 240B, respectively. Substrate 240B may provide interconnections between package 110B and package 230B. Resonator(s) 130B1 may optionally include one or more temperature sensors 132B. Circuits 140B1 may optionally include one or more temperature sensors 142B. Non-heated section 220B may include package 230B. Package 230B may be a ceramic package (e.g., Alumina (Al2O3) multilayered ceramic package), a plastic package (e.g., SOIC, SOT, QFN and the like package), and/or a metal package (e.g., TO-3, TO-41, and the like).

Substrate 240B may be a medium having one or more layers, such as a printed circuit board, which may connect electronic components-such as package 110B, package 230B, and optionally other electronic components (not shown in FIG. 2)—to one another. For example, substrate 240B may be comprised of combinations and permutations of aluminum, copper, ceramic, phenolic paper (e.g., FR-1 and FR-2), woven fiberglass (e.g., FR-4), polyimide foil, polyimide-fluoropolymer composite foil, and the like. Cover 250B may enclose package 110B and/or package 230B on substrate 240B, for example, to provide physical protection from environmental conditions such as moisture, impacts, and the like. Cover 250B may be plastic, metal, combinations thereof, or other materials. By way of further non-limiting example, cover 250B may be optional or encapsulation. Thermal vias 242B may be small holes through substrate 240B filled with a thermally conductive material, such as copper and/or aluminum. Thermal vias 242B may act as a heatsink and draw heat from package 230B.

As shown, there may be circuits 140B1 in heated section 210B and circuits 140B2 in non-heated section 220B. Constituents of circuits 140A (FIG. 1) may be divided between circuits 140B1 and circuits 140B2. For example, operation of resonator 130B1 may benefit from having constituents of circuits 140A close to resonator 130B1 (e.g., in heated section 210B). Other constituents of circuits 140A-which may not benefit operation of resonator 130B1 by being disposed in heated section 210B and/or may contribute to self-heating—may be disposed in non-heated section 220B. For example, constituents of circuits 140B1 may consume on the order of 1-10 mW, not including heater 144B, whereas constituents of circuits 140B2 may consume on the order of 10-200 mW.

Optional resonator(s) 130B2 may be coupled to circuits 140B2. Although heater 144B is shown in circuits 140B1, alternatively or additionally there may be a heater in resonator(s) 130B1 (not shown in FIG. 2).

Cavity 120B may be filled with a fluid having a lower thermal conductivity than, for example, air (26.2 mW/(m K)) and/or nitrogen gas (26.0 mW/(m K)). In this way, heat loss through cavity 120B may be decreased and heater power consumption may be reduced. Gases having a relatively low thermal conductivity, such as (combinations and permutations of) xenon (Xe; 5.5 mW/(m K), P=0), krypton (Kr; 9.5 mW/(m K), P=0), dichlorodifluoromethane ($CCl_2F_2$; 9.9 mW/(m K)), carbon dioxide ($CO_2$; 16.8 mW/(m K)), and argon (Ar; 17.9 mW/(m K)), may be used to fill cavity 120B. Except where noted, the example thermal conductivities of gases are at 300° K and pressure P=1 bar. By way of further non-limiting example, a vacuum (e.g., 1.0 Ba>P>1.0 μBa) may be in cavity 120B (e.g., package 110B may be vacuum sealed). It will be apparent to one of ordinary skill in the art that large-molecule and/or large-atomic gasses (and combinations and permutations thereof) often may have low thermal conductivity. Accordingly, the foregoing list is provided by of example and not limitation.

Combinations and permutations of low thermal conductivity gasses and vacuum may be used together in cavity 120B. This may provide a lower thermal conductivity than one gas and/or vacuum alone. Optimal gas selection criteria may include: not chemically reactive (not reactive with package 110B and/or contents of package 110B), chemically inert, environmentally friendly, non-toxic, manageable in a package assembly environment, low cost, and the like.

An additional benefit of large-molecule and/or large-atomic gasses is that they may be more readily sealed and have lower leak rates than small-molecule and/or small-atomic gasses, such as $H_2$ (small molecule) and/or He (small atomic). Accordingly, using the large-molecule and/or large-atomic gasses may result in improved package durability and reliability.

Package 110B may be sealed to keep the gas and/or vacuum in cavity 120B. For example, package 230B may be hermetically sealed.

Resonator(s) 130B1 may be other MEMS devices that may benefit from thermal management. By way of illustration and not limitation, resonator(s) 130B1 may be a gyroscope, accelerometer, vibrometer, magnetic field sensor, transducer, chemical detector, and/or other MEMS devices. A chemical detector may be a gas sensor (e.g., hydrogen, helium, ammonia, carbon monoxide, carbon dioxide, nitrogen oxides, and various pollutants). OCXO 100B may expose the MEMS devices (e.g., resonator(s) 130B1) to the gas (e.g., lid 112B and/or cover 250B may be permeable to the gas and/or vented).

Circuits Partitioning

Figure 3:
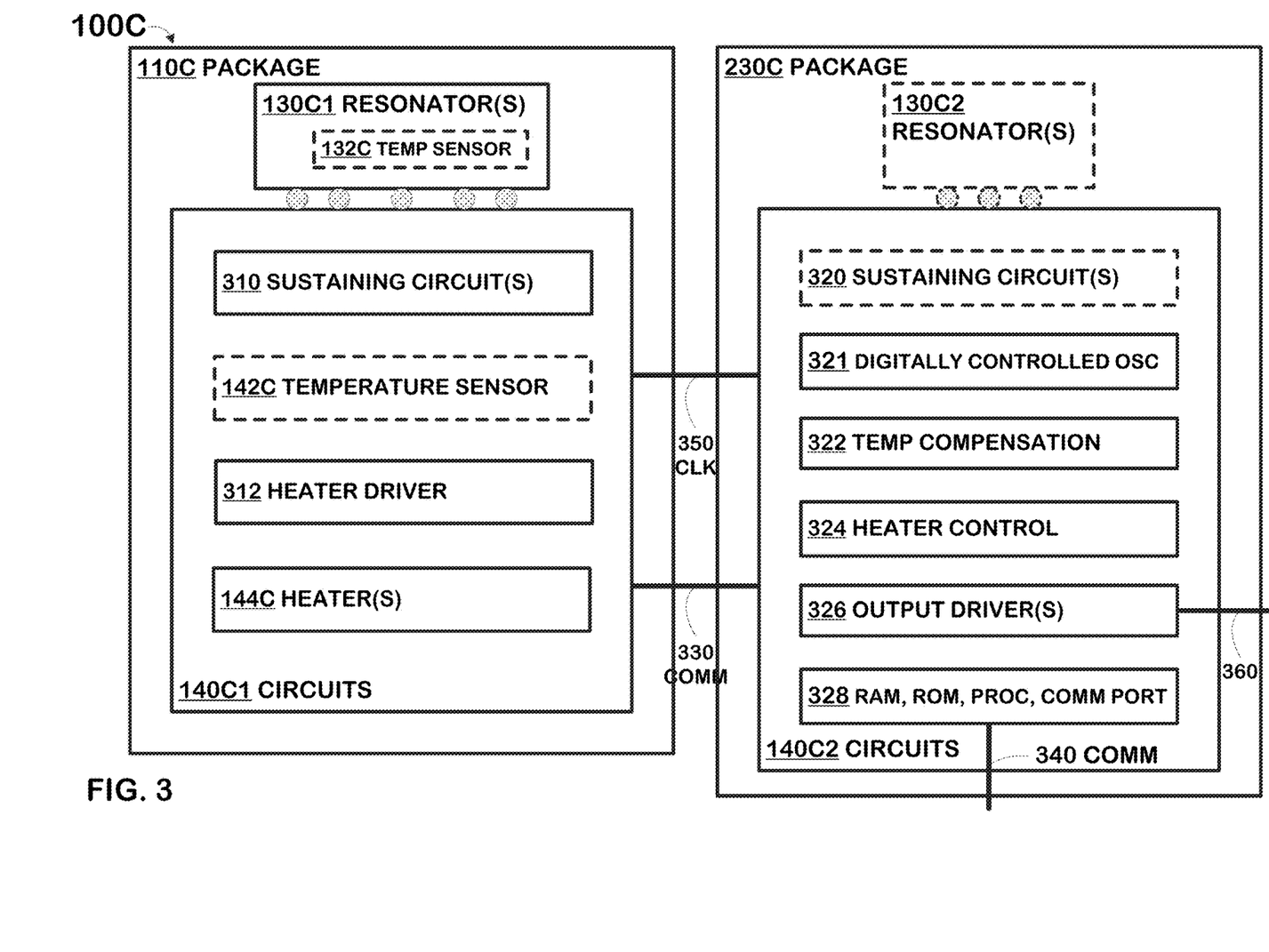
FIG. 3 illustrates electronic circuits partitioning, in accordance with some embodiments.

FIG. 3 shows OCXO 100C according to some embodiments. FIG. 3 illustrates a partitioning of electronic circuits functions/operations among circuits 140C1 (e.g., in heated section 210B (FIG. 2)) and circuits 140C2 (e.g., in non-heated section 220B (FIG. 2)), according to some embodiments. OCXO 100C may have at least some of the characteristics of OCXO 100A and 100B (FIGS. 1 and 2).

As shown, circuits 140C1 in package 110C may be connected to resonator(s) 130C1. Resonator(s) 130C1 may optionally include one or more temperature sensors 132C and/or one or more heaters 134C. A periodic, oscillating signal(s) generated using resonator(s) 130C1 may be provided by circuits 140C1 to circuits 140C2 through CLK signal 350, referred to hereinafter as a reference clock. Circuits 140C1 and circuits 140C2 may communicate (e.g., sensor, status/state, and control information) with each other through communications 330. For example, communications 330 may be combinations and permutations of discrete signals (e.g., temperature sensor 142C and/or 132C output from circuits 140C1 to circuits 140C2, heater control from circuits 140C2 to circuits 140C1, data from system logic 328 (e.g., RAM and/or ROM), and the like), serial busses (e.g., Serial Peripheral Interface (SPI), I2C, and the like), parallel busses, and the like.

Circuits 140C1 may include sustaining circuit(s) 310, optional temperature sensor 142C, heater driver 312, and heater(s) 144C. Sustaining circuit(s) 310 may initiate and maintain periodic oscillations in resonator(s) 130C1. For example, sustaining circuit(s) 310 may be one or more amplifiers having a gain greater than 1. Optional temperature sensor 142C may sense a temperature in circuits 140C1 which may be used to determine a temperature of resonator(s) 130C1 and/or circuit blocks of circuits 140C1. Optional temperature sensor 142C may be combinations and permutations of a resistive-based temperature sensor (e.g., Resistance Temperature Detector (RTD) or similar), a discrete circuit-based sensor (e.g., bipolar junction transistor (BJT), diode (bipolar junction), MOSFET transistor, or similar), and other type of temperature sensors (e.g., thermocouple, thermopile, acoustic velocity thermometer, variable conductance thermometer, variable capacitance thermometer, variable inductance thermometer, and the like). Optional temperature sensor 132C may sense a temperature on a silicon die of resonators 130C1. Optional temperature sensor 132C may be combinations and permutations of a resonator whose resonant frequency varies with temperature in a predetermined manner, a resistive-based temperature sensor (e.g., Resistance Temperature Detector (RTD) or similar), a discrete circuit-based sensor (e.g. BJT or similar), and other type of temperature sensor.

For example, resonator(s) 130C1 may be a temperature stable resonator (e.g., variation on the order of 1 PPM/° C. or less) and temperature sensor 132C may be a temperature sensitive resonator (e.g., variation on the order of 5 PPM/° C. or less). In some embodiments, the temperature stable resonator and the temperature sensitive resonator may be in one resonator having temperature stable and temperature sensitive resonant modes. The periodic signals from the temperature stable and temperature sensitive resonators/modes may be processed to produce a temperature compensated reference periodic signal and temperature measurement. The examples for temperature stability (e.g., 1 PPM/° C.) and temperature sensitivity (e.g., 5 PPM/° C.) are provided for illustrative purposes. Other examples, where the temperature stability and temperature sensitivity are different values may be used. A temperature sensor using MEMS resonators is described further in U.S. Pat. No. 10,247,621 titled "High Resolution Temperature Sensor" which is incorporated by reference herein for disclosure of temperature sensing.

Heater driver 312 may control the amount of heat generated by heater(s) 144C and/or heater(s) 134C. For example, heater driver 312 may be an electronic current control circuit that supplies varying electronic current based on the temperature as measured by temperature sensor 132C and/or 142C. Heater(s) 144C and/or heaters 134C may produce heat to maintain resonator(s) 130C1 and/or circuit blocks of circuits 140C1 at the target temperature. For example, heater(s) 144C and/or heaters 134C may be combinations and permutations of diffused resistors, ion-implanted resistors, thin-film resistors, polysilicon resistors, transistors (e.g., BJT and MOSFET), and the like. By way of non-limiting example, circuits 140C1 may consume on the order of 1-10 mW and raise the temperature in package 110C on the order of 1-10° C. (e.g., due to self-heating), not including the effects of heaters 144C and heaters 134C.

Circuits 140C2 may include optional sustaining circuit(s) 320, digitally controlled oscillator 321, temperature compensation 322, heater control 324, output driver(s) 326, and system logic 328 (e.g., volatile memory (e.g., RAM, DRAM, SRAM, and the like), non-volatile memory (e.g., ROM, EEPROM, FLASH, and the like), processor (e.g., logic, state machine, microprocessor, and the like), communications port (e.g., SPI, I2C, and the like), etc.). The communications port in system logic 328 may communicate with an external computer system before and/or after the electronic oscillator is sold to configure circuits 140C2. For example, coefficients used by temperature compensation 322 may be programmed into a memory of system logic through communications 340 and communications port in system logic 328. By way of further non-limiting example, an end user may configure an output frequency through communications 340 and communications port in system logic 328.

Optional sustaining circuits 320 may initiate and maintain periodic oscillations in optional resonator(s) 130C2. For example, optional sustaining circuit(s) 320 may be one or more amplifiers having a gain greater than 1. Digitally controlled oscillator 321 may use the reference clock generated by circuits 140C1 as an input and may perform functions such as reducing the jitter from clock generated by circuits 140C1, providing synthesis of other clock frequencies based on the clock generated by circuits 140C1, enable the ability to adjust the clock frequency based on the input through communications port 340, and the like. For example, digitally controlled oscillator 321 may include a voltage-controlled oscillator (VCO) driven by a control signal from a digital-to-analog converter (not depicted in FIG. 3). Optional resonator(s) 130C2 may communicate with circuits 140C2. For example, optional resonator(s) 130C2 may provide a low-jitter clock reference to digitally controlled oscillator 321.

Temperature compensation 322 may compensate for changes in the resonant frequency of resonator(s) 130C1 over its operating temperature range. In operation, heater(s) 144C may produce heat to maintain resonator(s) 130C1 and/or circuit blocks of circuits 140C1 at the target temperature. When OCXO 100C starts up (e.g., OCXO 100C is at ambient temperature and not at the target temperature) or when the ambient temperature changes/fluctuates, the temperature of resonator(s) 130C1 and/or circuit blocks of circuits 140C1 may not be at the target temperature. Here, for example, the relationship between temperature and frequency of the resonator(s) 130C1 may be approximated by a polynomial function. The polynomial function may approximate the change from the desired frequency at a particular temperature (e.g., determined by temperature sensor 132C and/or temperature sensor 142C) and the digitally controlled oscillator 321 may adjust its frequency multiplication value based on the output of the polynomial function to compensate for the change in frequency produced by resonator(s) 130C1 due to the deviation from the target temperature.

Heater control 324 may determine the temperature of resonator(s) 130C1 and/or circuit blocks of circuits 140C1 using output from temperature sensor 132C and/or temperature sensor 142C and control (e.g., increase, decrease, and/or maintain an amount of heat generated by) heater(s) 144C and/or heaters 134C. Heater control may generate an analog and/or digital control signal (e.g., a digital value that corresponds to the amount of heater current) and provide it to heater driver 312 through communications 330.

Output driver(s) 326 may produce an output signal for the electronic oscillator. The output signal may be generated using combinations and permutations of resonator(s) 130C1, resonator(s) 130C, temperature compensation 322, and digitally controlled oscillator 321. Output driver(s) 326 may include combinations and permutations of a current-controlled switch, voltage-controlled switch, bipolar junction transistor (BJT), junction-gate field-effect transistor (JFET), (n- and/or p-type) metal-oxide-semiconductor field-effect transistor (MOSFET), and the like. By way of non-limiting example, output driver(s) 326 may be a complementary metal-oxide-semiconductor (CMOS) inverter, totem pole output, and the like to produce combinations and permutations of CMOS, TTL, LVCMOS, and the like signals at output 360. By way of further non-limiting example, output driver(s) may additionally or alternatively be differential, such as combinations and permutations of low-voltage differential signaling (LVDS), low-voltage positive emitter-coupled logic (LVPECL), current mode logic (CML), and the like at output 360.

While solder bumps for interconnect-between resonator(s) 130C1 and circuits 140C1, and resonator(s) 130C2 and circuits 140C2—are depicted in FIG. 3, other interconnect may be used, such as bond wires.

Although circuits 140C1 and circuits 140C2 are depicted as having certain functions (e.g., sustaining circuit(s) 310, optional temperature sensor 142C, heater driver 312, heater(s) 144C, optional sustaining circuit(s) 320, digitally controlled oscillator 321, temperature compensation 322, heater control 324, output driver(s) 326, system logic 328), it is understood that combinations and permutations of the functions may be partitioned among circuits 140C1 and circuits 140C2. By way of non-limiting example, heater control 324 may be in circuits 140C1.

Package

As illustrated in FIG. 2, package 110B of heated section 210 and package 230B of non-heated section 220B may be disposed planarly (e.g., adjacent to each other, side by side, and the like) on substrate 240B. Heated section 210 and non-heated section 220B may have other spatial orientations. By way of non-limiting example, heated section 210 and non-heated section 220B may be oriented vertically. FIGS. 4-8 illustrate OCXOs 100D-100H having vertically oriented heated and non-heated sections, according to some embodiments. Each of OCXOs 100D-100H may have at least some of the characteristics of OCXOs 100A-100C (FIGS. 1-3), vice-versa, and each other.

Figure 4:
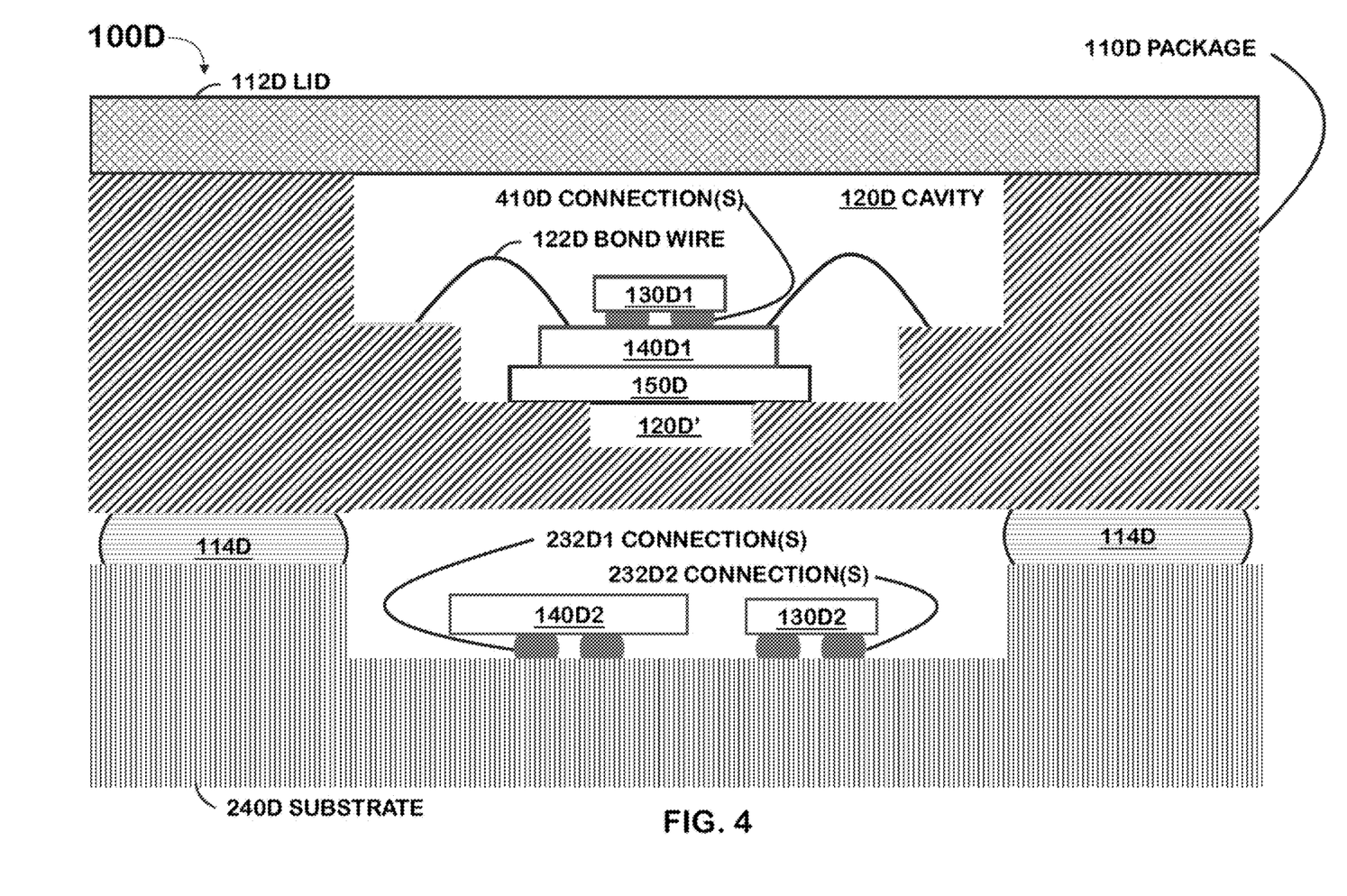
FIGS. 4-8 illustrate packages, in accordance with various embodiments.

FIG. 4 shows OCXO 100D including package 110D oriented above substrate 240D. Package 110D may be in a heated section (e.g., heated section 210 in FIG. 2) and include lid 112D, connections 114D, cavity 120D, resonators 130D1, circuits 140D1, and insulator (separator) 150D. Substrate 240D may be in a non-heated section (e.g., non-heated section 220B in FIG. 2) and include resonator(s) 130D2 and circuits 140D2.

Circuits 140D1 may be electrically and/or thermally coupled to package 110D through bond wires 122D. Package 110D may be electrically and/or thermally coupled to substrate 240D through connections 114D. Substrate 240D may be electrically and/or thermally coupled to another substrate, package, module, and the like, such as through pins, solder balls, and the like (not depicted in FIG. 4).

Package 110D may include cavity 120D' beneath insulator 150D. Since insulator 150D may not make physical contact with package 110D where insulator 150D is above cavity 120D', the amount of heat leaking out of package 110D through insulator 150D may be reduced.

As shown, substrate 240D may include a cavity/indentation so that there is sufficient clearance for package 110D to be disposed above resonator(s) 130D2 and/or circuits 140D2. Thermal vias in substrate 140D (not depicted in FIG. 4) may act as a heatsink for heat produced by resonator(s) 130D2 and/or circuits 140D2.

Figure 5:
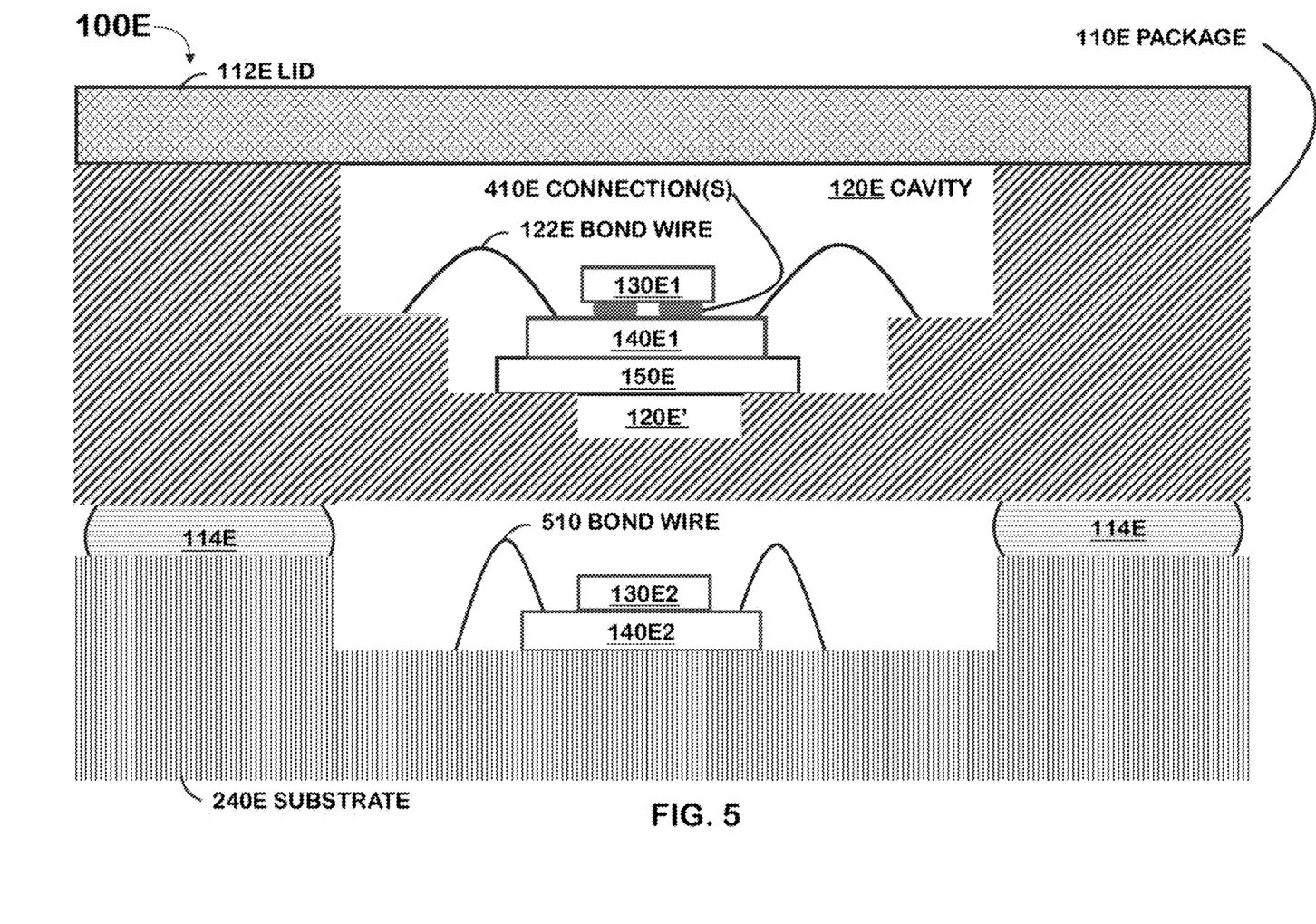
Figure 6:
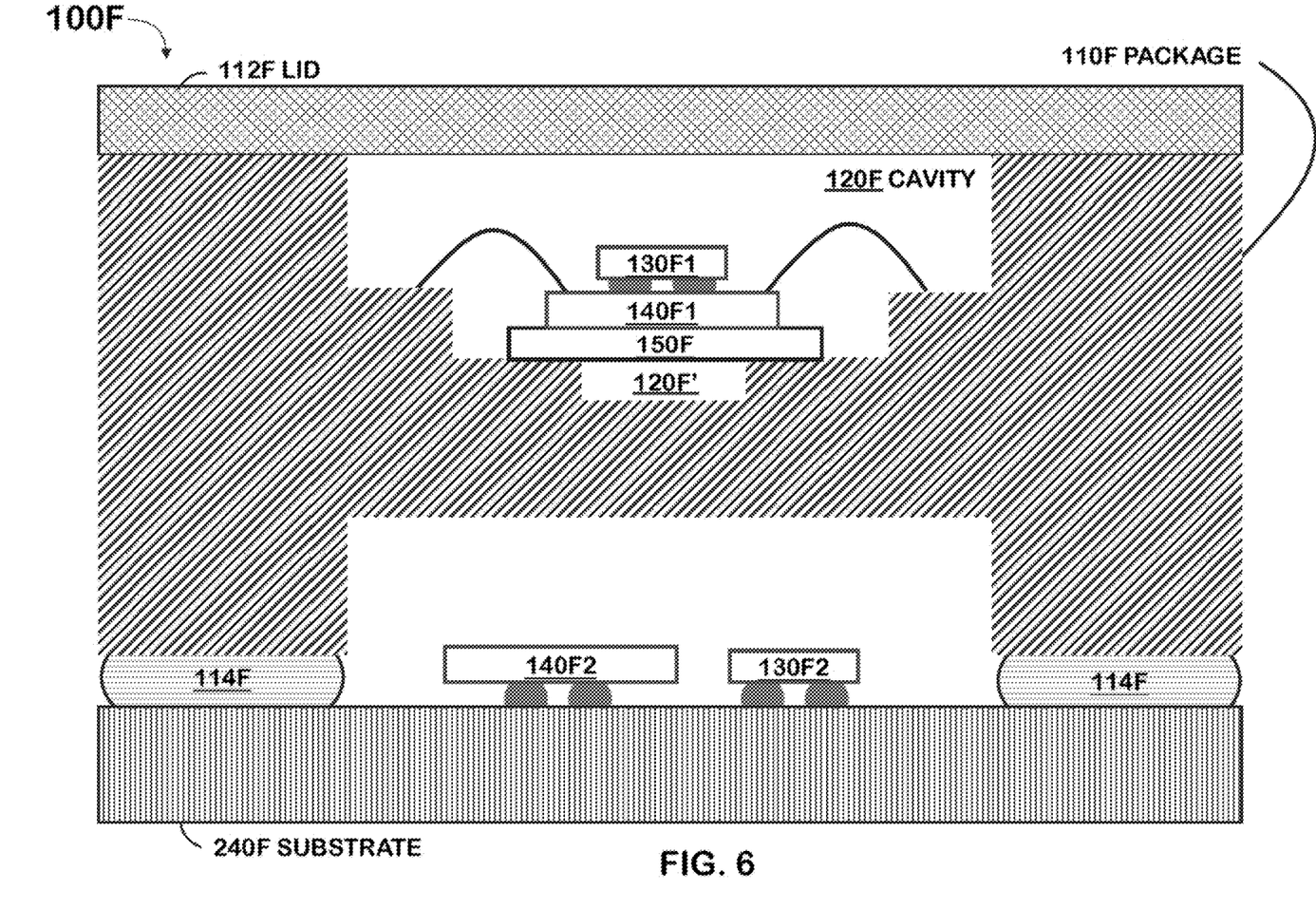
Figure 7:
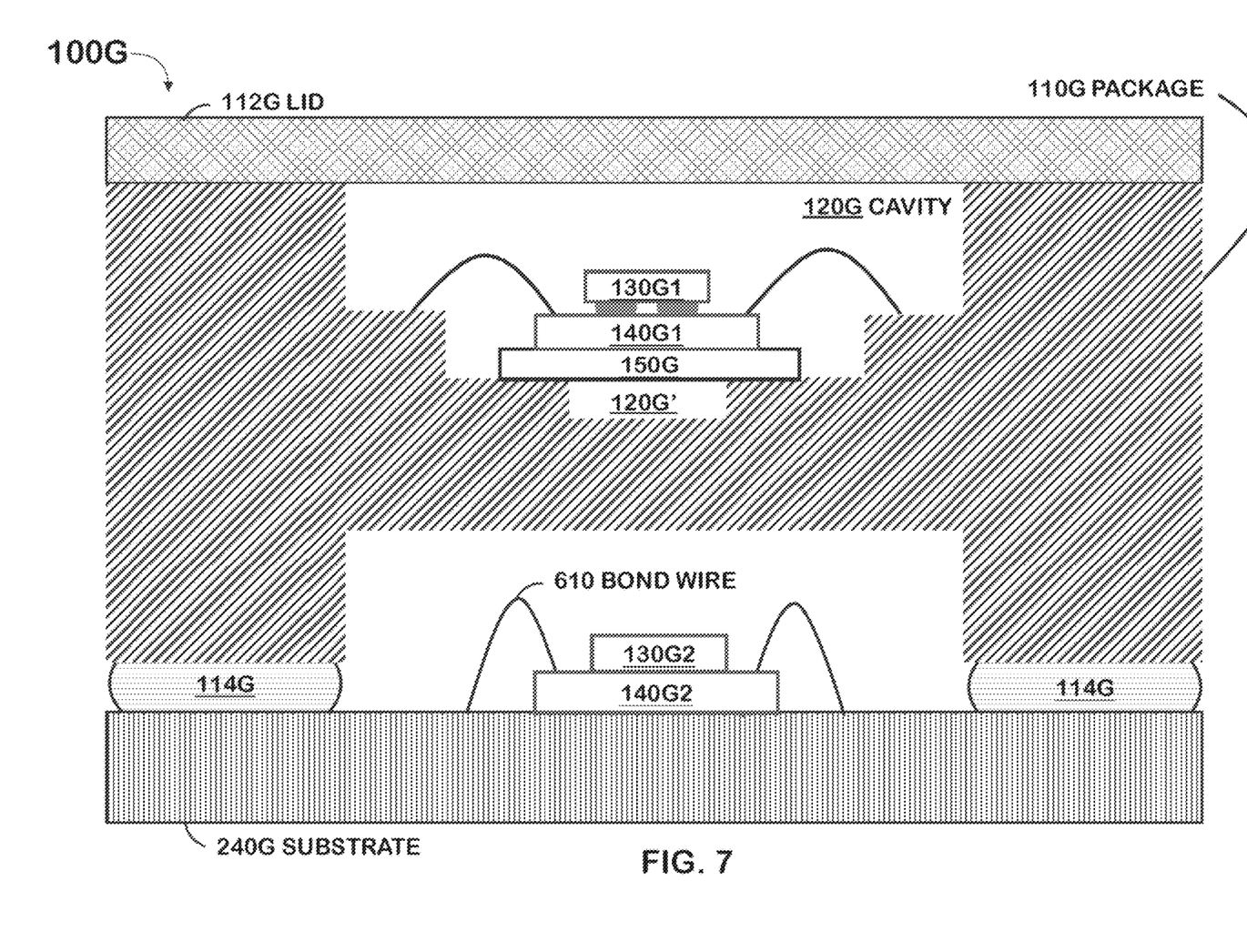

Bond wires 122D, connections 232D1, connections 232D2, and connections 410D may be combinations and permutations of bond wires, solder balls, through-silicon vias (TSVs), and the like. For example, bond wires 510 may electrically and/or thermally couple circuits 140E2 to substrate 240E, as shown in FIG. 5. As shown, substrate 240E may include a cavity/indentation so that there is sufficient clearance for package 110E to be disposed above bond wires 510, resonator(s) 130E2, and/or circuits 140E2. Package 110F in FIG. 6 may include a cavity to provide space for resonator(s) 130F2 and/or circuits 140F2. Solder balls may electrically couple resonator(s) 130F2 and/or circuits 140F2 to substrate 240F. Bond wires, through-silicon vias (TSVs), and the like may alternatively or additionally be used. For example, bond wires 610 may electrically and/or thermally couple circuits 140G2 to substrate 240G, as shown in FIG. 7.

Figure 8:
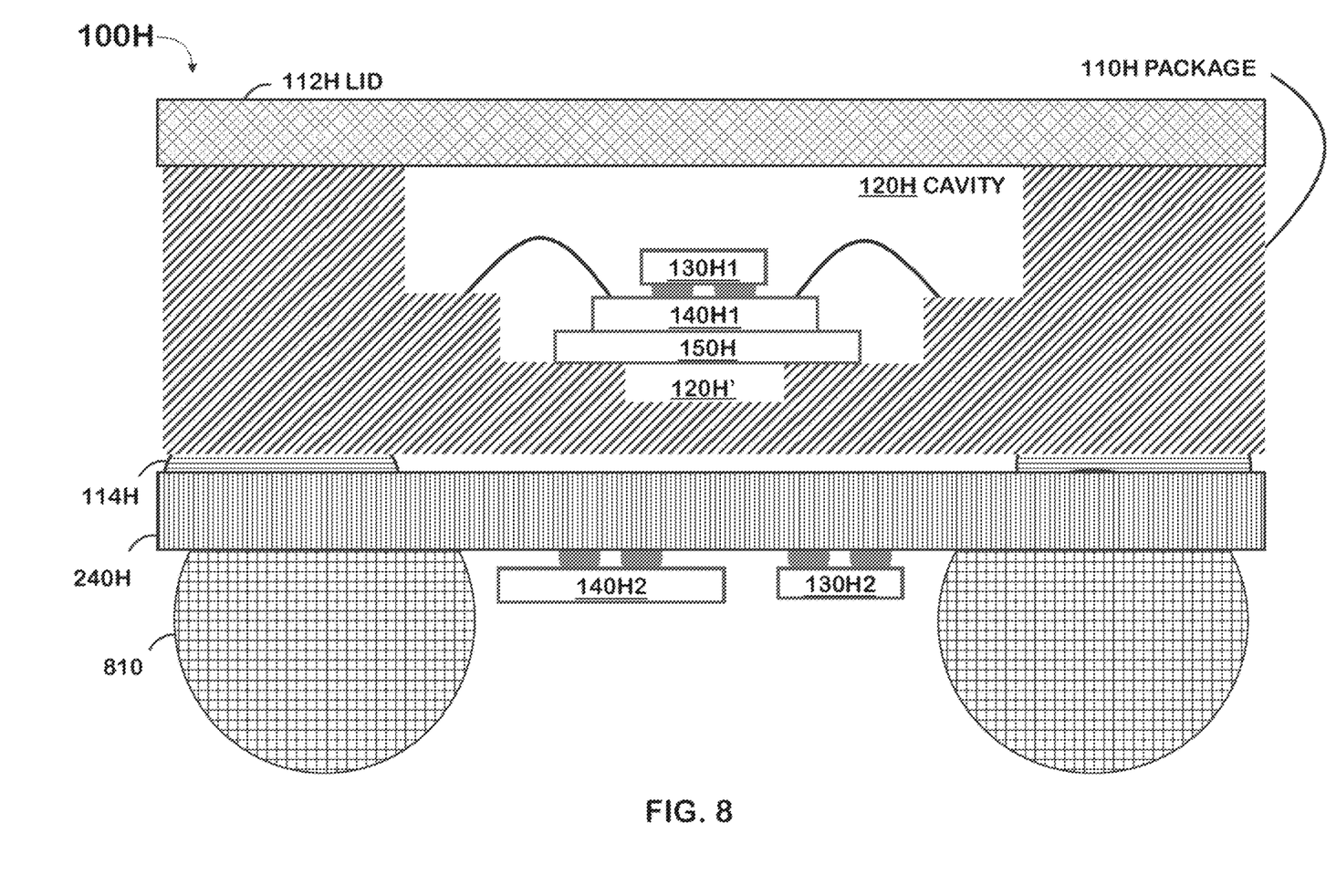

FIG. 8 shows OCXO 100H according to some embodiments. As shown, resonator(s) 130H2 and/or circuits 140H2 may be disposed (e.g., mounted/attached) on a surface of substrate 240H that is opposite of a surface of substrate 240H upon which package 110H is disposed (e.g., mounted/attached). Connections 810 may have sufficient size to create a space for resonator(s) 130H2 and/or circuits 140H2 (e.g., so there is room for them when OCXO 100H is mounted to another substrate, module, package, and the like). Connections 810 may be combinations and permutations of solder balls, pins, and the like.

Insulator

Referring back to FIG. 2, package 110B may advantageously have a high thermal resistance, for example, so that less power is consumed to maintain the target temperature. In contrast, package 230B may advantageously have a low thermal resistance, for example, to dissipate the heat produced by circuits 140B2. Substrate 240B may be designed to advantageously minimize thermal crosstalk between package 110B and package 230B. For example, substrate 240B may be relatively thermally insulative around package 110B and substrate 240B may be relatively thermally conductive about package 230B. By way of further non-limiting example, the metal layer(s), metal trace(s), and/or via(s) (e.g., density, quantity, dimensions, geometry, placement, and the like) may be designed for optimal thermal characteristics.

In general, ceramic packages may have a thermal resistance-between the semiconductor die inside the package to the circuit board on which the package is mounted (from junction to ambient), referred to as $\theta_{JA}$-on the order of 30° C./W to 100° C./W. Typically, most (e.g., >95%) of heat may dissipate from the semiconductor die to the bottom of the ceramic package to the connections (e.g., solder balls, pins, and the like) to the circuit board. Generally, heat dissipation from bond wires may be negligible (e.g., <5%).

In contrast, package 110B may advantageously have a $\theta_{JA}$ on the order of 100° C./W to 1500° C./W. In package 110B, heat may dissipate through the bottom of package 110B (e.g., ~20%-80%), through bond wires 124B (~10%-50%), and gas/vacuum in cavity 120B (~10%-50%). The thermal resistance through the bottom of package 110B may be increased by having one or more of insulator 150B. Additionally or alternatively, bond wires 124B may be thinner to increase the thermal resistance in this path.

FIGS. 9A-9D show insulator examples 900A-900D (respectively) from top/bottom and side views, according to some embodiments. Insulator examples 900A-900D may include circuits 910A-910D and insulators 920A-920D. Circuits 910A-910D may have least some of the characteristics of circuits 140B1 in FIG. 2 and/or circuits 140C1 in FIG. 3, and vice versa. Insulators 920A-920D may have at least some of the characteristics of insulator 150B in FIG. 2, and vice versa. Insulators 920A-920D may each comprise low thermal expansion glasses, low thermal expansion ceramics, and the like. By way of non-limiting example, insulators 920A-920D may comprise a material having a thermal resistance less than 2 W/(m K), where W is Watts, m is meters, and K is a temperature in Kelvin.

Figure 9A:
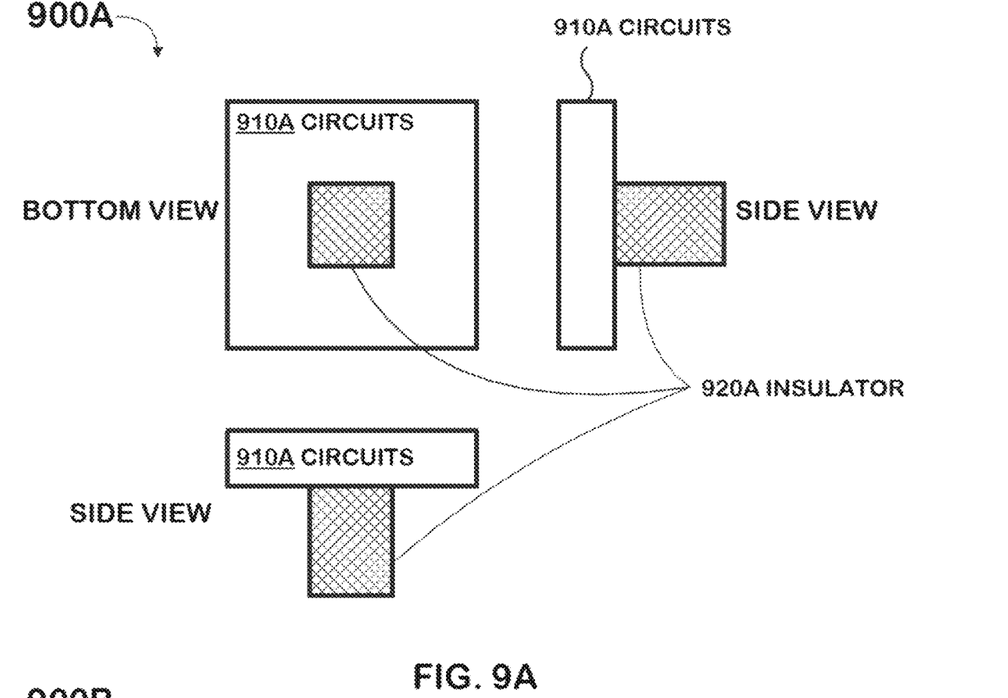
FIGS. 9A-9D illustrate insulators, according to some embodiments.
Figure 9B:
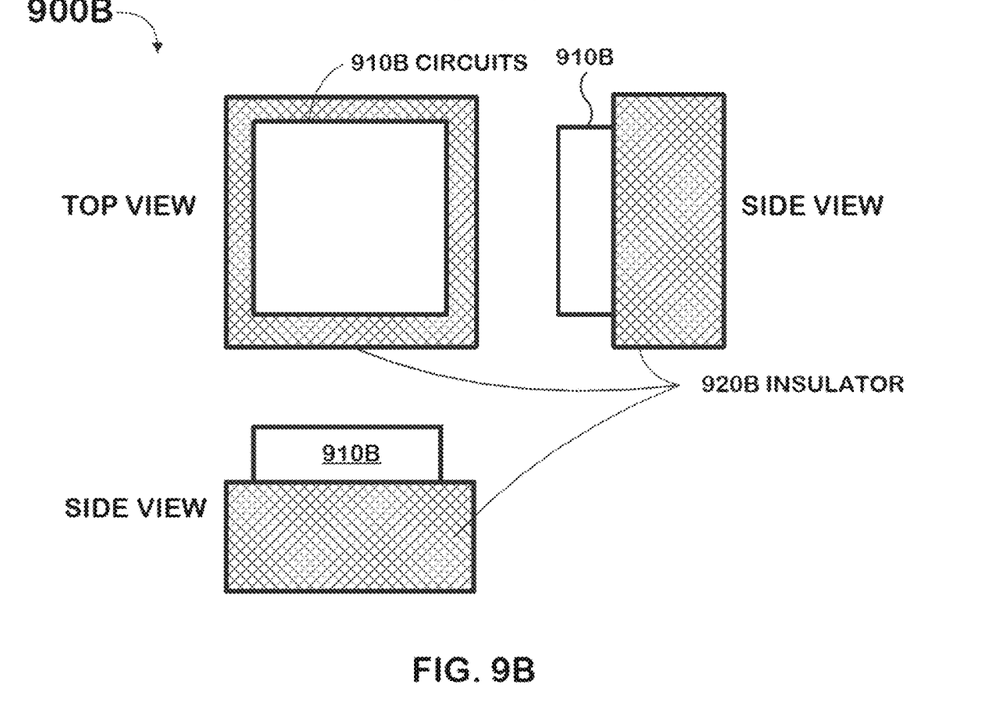

FIG. 9A depicts small size insulator 920A. FIG. 9B illustrates large/equal size insulator 920B. The sizes may be relative to circuits 910A and 910B, which may be semiconductor die. Small size insulator 920A may advantageously have a thermal resistance on the order of 100° C./W to 1500° C./W. Alternatively or additionally, small size insulator 920A may advantageously isolate circuits 140B1 from stress from package 110B. In contrast, large/equal size insulator 920B may have a thermal resistance on the order of 100° C./W to 300° C./W.

Figure 9C:
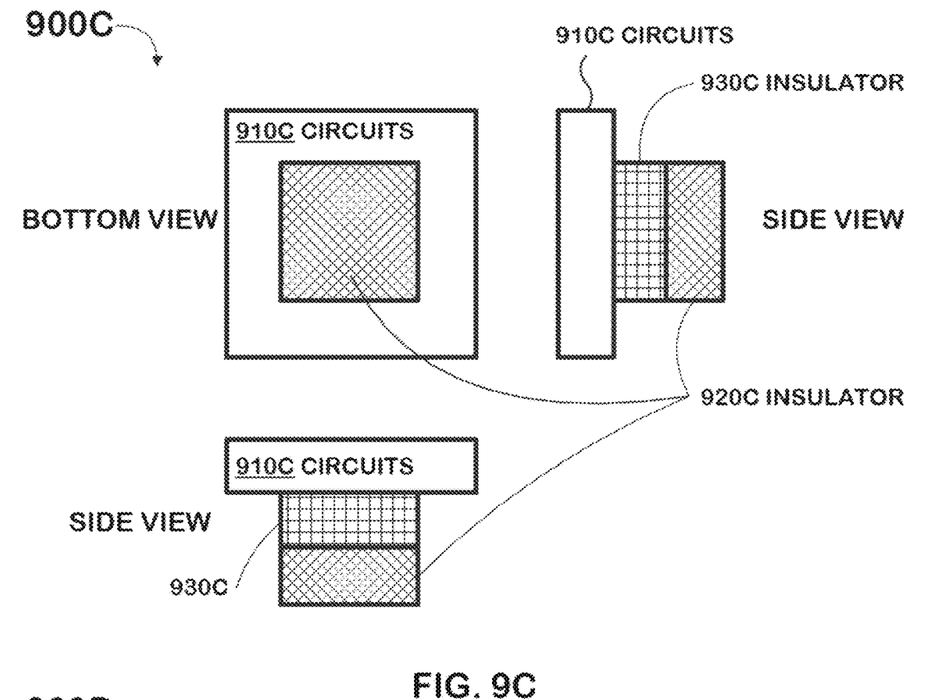
Figure 9D:
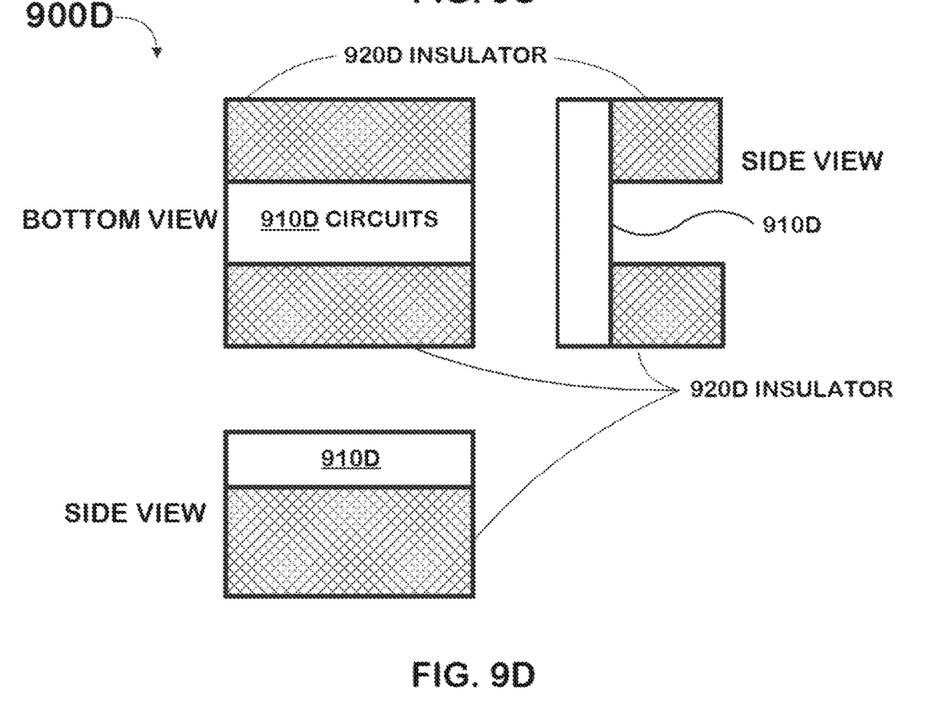

FIG. 9C shows insulators 920C and 930C stacked. FIG. 9D depicts parallel insulators 920D. Stacked insulators 920C and 930C together may advantageously have a thermal resistance on the order of 200° C./W to 1500° C./W. Although two insulators are provided as an example, more insulators may be stacked. Parallel insulators 920D may advantageously have a thermal resistance on the order of 200° C./W to 1000° C./W. It will be understood that combinations and permutations of multiple insulators having different sizes, being stacked, and/or being in parallel may be used.

Heater

Figure 10:
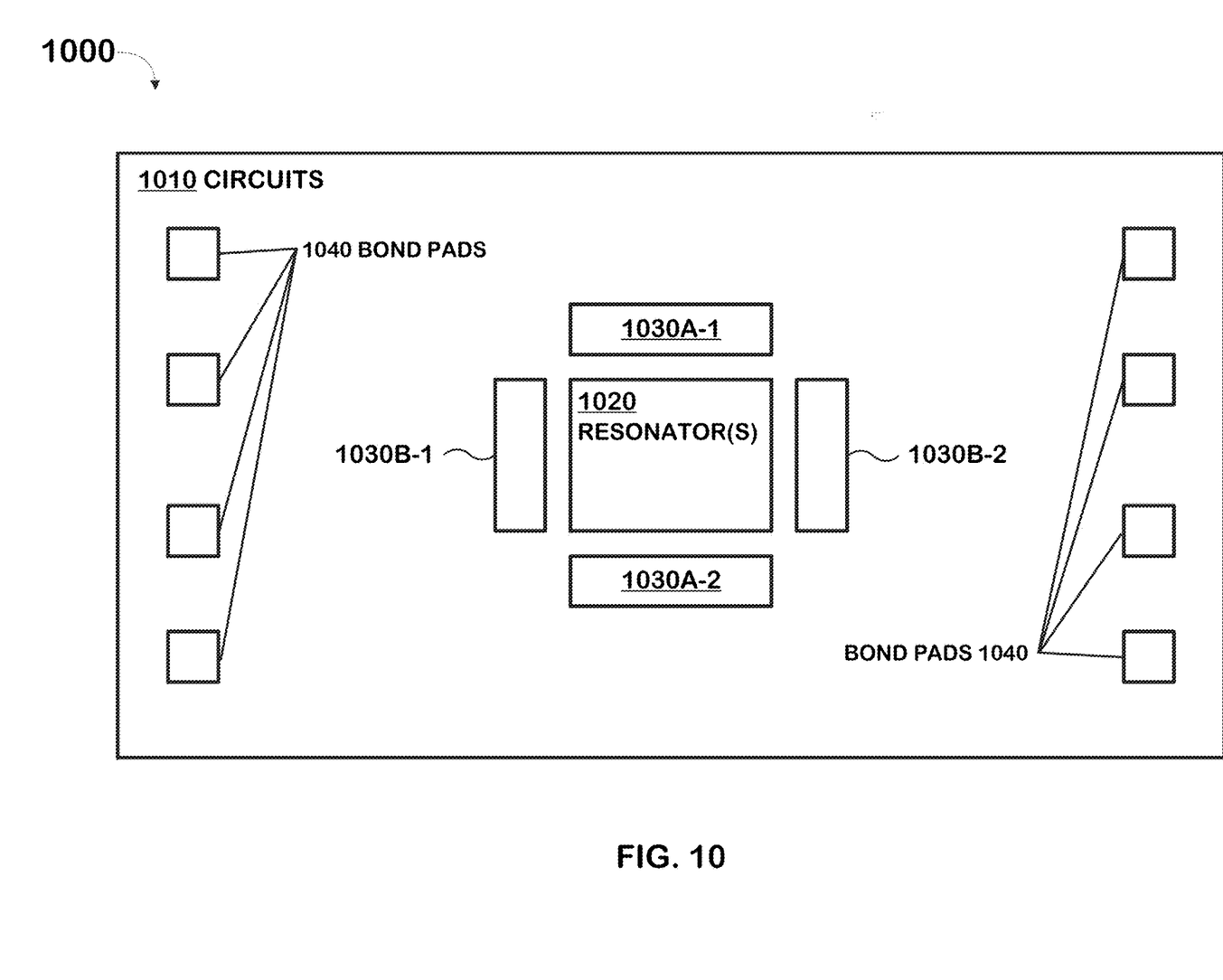
FIG. 10 illustrates heaters, according to various embodiments.

FIG. 10 shows heater example 1000, according to some embodiments. Heater example 100 is provided by way of example and not limitation. Heater example 1000 may include circuits 1010, resonator(s) 1020, and bond pads 1040. Circuits 1010 may include heaters 1030A-1, 1030A-2, 1030B-1, and/or 1030B-2. Circuits 1010 may have at least some of the characteristics of circuits 140B1 in FIG. 2, circuits 140C1 in FIG. 3, and/or circuits 910A-910D in FIGS. 9A-9D, and vice versa. Resonator(s) 1020 may have at least some of the characteristics of resonator(s) 130A in FIG. 1, resonator(s) 130B1 in FIG. 2, and/or resonator(s) 130C1 in FIG. 3, and vice versa. Heaters 1030A-1, 1030A-2, 1030B-1, and/or 1030B-2 may have at least some of the characteristics of heater 144A in FIG. 1, heater 144B in FIG. 2, and/or heater 144C in FIG. 3, and vice versa.

One or more of heaters 1030A-1, 1030A-2, 1030B-1, and/or 1030B-2 may be used to provide heat to resonator(s) 1020. For example, there may be one of or combinations of heaters 1030A-1, 1030A-2, 1030B-1, and/or 1030B-2. Although heaters 1030A-1, 1030A-2, 1030B-1, and/or 1030B-2 are shown having a length of an adjacent side of resonator(s) 1020, they may each be longer or shorter.

Heaters 1030A-1, 1030A-2, 1030B-1, and/or 1030B-2 may each be combinations and permutations of diffused resistors, ion-implanted resistors, thin-film resistors, polysilicon resistors, and the like. Heaters 1030A-1, 1030A-2, 1030B-1, and/or 1030B-2 may be segmented, for example, divided into sections which may be individually or collectively controlled (not shown in FIG. 10)

Heat from circuits 1010 may be conducted through package bond pads 1040XX and bond wires (not shown in FIG. 10). To prevent thermal gradients (e.g., temperatures differences across regions of circuits 1010 and resonator(s) 1020) from forming the disposition of bond pads 1040 on circuits 1010 may be symmetric. For example, when circuits 1010 is viewed in halves, there may be an equal number of bond pads 1040 on both halves. By way of further non-limiting example, the foregoing symmetric quantity and placement may yield a thermal gradient across circuits 1010 and/or resonator(s) 1020 on the order of 10.0 E-3° C. or less which may be referred to as a uniform thermal gradient.

Although bond pads 1040 are shown being of equal size and equal distance from each other, bond pads 1040 may be of different sizes, quantities, and spacing from each other. Bond wires associated with bond pads 1040 may also have different lengths. The size, number, and spacing of bond pads 1040 and the bond wires associated with bond pads 1040 may be designed for uniform thermal conductivity and hence uniform temperature across circuits 1010 and resonator(s) 1020. The size, number, and placement of heaters 1030A-1, 1030A-2, 1030B-1, and/or 1030B-2 may be adjusted to compensate for asymmetric thermal conduction through bond pads 1040 and bond wires associated with bond pads 1040. In operation, the power provided to each of heaters 1030A-1, 1030A-2, 1030B-1, and/or 1030B-2 may be controlled to compensate for asymmetric thermal conduction through bond pads 1040 and bond wires associated with bond pads 1040. The foregoing techniques may, for example, yield a thermal gradient across circuits 1010 and/or resonator(s) 1020 on the order of 1.0 E-3° C. or less which may be referred to as a highly uniform thermal gradient.

We claim:

1. A device comprising:
   a heated section including a first die and a second die, wherein:
   the first die includes a heater, and
   the second die is coupled to the first die and includes a temperature sensor and a microelectromechanical system (MEMS) resonator; and
   a non-heated section electrically coupled to the heated section and including a third die, wherein:
   the third die receives a first signal associated with the temperature sensor and provides a second signal to the first die associated with the heater based on the first signal to maintain the heated section at a predetermined temperature, wherein
   the first die further includes a sustaining circuit coupled to the resonator, and
   the third die receives a third signal associated with the sustaining circuit and generates a periodic signal using temperature compensation.

2. The device of claim 1, wherein the first die further includes a heater driver, the heater driver controlling the amount of heat generated by heater using the second signal.

3. The device of claim 1, wherein the third die further includes a communications port, the communications port receiving configuration information for the temperature compensation.

4. The device of claim 1, wherein at least one of the first die, the second die, and the third die comprise silicon.

5. The device of claim 1, wherein the temperature sensor comprises at least one of a MEMS resonator, resistance temperature detector, and a bipolar junction.

6. The device of claim 1, wherein the heater comprises at least one of a diffused resistor, ion-implanted resistor, thin-film resistor, polysilicon resistor, and transistor.

7. The device of claim 1, wherein the non-heated section has a lower thermal resistance to an ambient temperature than the heated section.

8. The device of claim 1, wherein the non-heated section is thermally separated from the heated section.

9. A device comprising:
a substrate;
a first package coupled to the substrate, the first package comprising:
a first die including at least one heater, and
a second die coupled to the first die and including a temperature sensor and a resonator;
a second package coupled to the substrate, the second package comprising:
a third die receiving a first signal associated with the temperature sensor and providing a second signal associated with the at least one heater based on the first signal; and
a cover disposed over the substrate, first package, and second package, wherein
the first die further includes a sustaining circuit coupled to the resonator, and
the third die receives a third signal associated with the sustaining circuit and generates a periodic signal using temperature compensation.

10. The device of claim 9, wherein each of the first package and the second package is at least one of a ceramic package, a plastic package, and a metal package.

11. The device of claim 9, wherein the first package has a higher thermal resistance to an ambient temperature than the second package.

12. The device of claim 9, wherein the first package further comprises an insulator disposed between the first die and a portion of the first package.

13. The device of claim 12, wherein the insulator comprises at least one of glass and ceramic.

14. The device of claim 9, wherein the substrate is a printed circuit board.

15. The device of claim 14, wherein the substrate comprises at least one of aluminum, copper, phenolic paper, woven fiberglass, ceramic, polyimide foil, and polyimide-fluoropolymer composite foil.

16. The device of claim 9, wherein the cover comprises at least one of plastic and metal.

17. A device comprising:
a substrate;
a first package coupled to the substrate, the first package comprising:
an insulator coupled to the first package and a first semiconductor die,
the first semiconductor die including at least one heater and a sustaining circuit, and
a second semiconductor die coupled to the first semiconductor die and including a temperature sensor and a microelectromechanical system (MEMS) resonator; and
a second package coupled to the substrate, the second package comprising:
a third semiconductor die
receiving a first signal associated with the temperature sensor and a second signal associated with the sustaining circuit,
providing a third signal to the first die associated with the at least one heater based on the first signal, and
generating a fourth signal based on the second signal using temperature compensation.

18. The device of claim 17, wherein:
dimensions of the insulator are smaller than dimensions of the first die,
the first package is hermetically sealed and coupled to a first surface of the substrate, and
the second package is coupled to a second surface of the substrate.

* * * * *